United States Patent [19]

Mutter

[11] Patent Number: 4,530,736
[45] Date of Patent: Jul. 23, 1985

[54] METHOD FOR MANUFACTURING FRESNEL PHASE REVERSAL PLATE LENSES

[75] Inventor: Walter E. Mutter, Poughkeepsie, N.Y.

[73] Assignee: International Business Machines Corporation, Armonk, N.Y.

[21] Appl. No.: 548,387

[22] Filed: Nov. 3, 1983

[51] Int. Cl.³ .............. H01L 21/306; B44C 1/22; C03C 15/00; C03C 25/06
[52] U.S. Cl. .............................. 156/643; 156/646; 156/657; 156/659.1; 156/662; 156/663; 204/192 E; 252/79.1; 350/417; 350/452; 430/321; 430/323
[58] Field of Search ........... 156/643, 646, 657, 659.1, 156/662, 663; 252/79.1; 204/164, 192 E; 430/321, 323, 329, 313; 350/162.16, 409, 417, 452, 438

[56] References Cited

U.S. PATENT DOCUMENTS 3,948,660  4/1976  Deml .................................. 96/38.3
4,384,938  5/1983  Desilets et al. .................... 204/298

OTHER PUBLICATIONS

"Physical Optics" by Robert W. Wood copyrighted 1934, 1961 by Dover Publications Incorporated, New York, N.Y., pp. 37 through 39.

"Optics" by Miles V. Klein, published by John Wiley & Sons, Inc., 1970, pp. 382 through 388.

"Optical Physics" by S. G. Lipson et al., published by Press Syndicate of the University of Cambridge, England, 1981, p. 135.

"Handbook of Thin Film Technology" by L. I. Maissel and R. Glang, published by McGraw Hill 1970, on pp. 1-114 and 1-115.

"Sensitometry of Resists for Microelectronics" by D. B. Novotny, Photographic Science and Engineering, vol. 21, No. 6, Nov./Dec. 1977, pp. 351-355.

"Solid State Technology" by L. M. Ephrath, Jul. 1982, pp. 87-91.

*Primary Examiner*—William A. Powell
*Attorney, Agent, or Firm*—George O. Saile

[57] ABSTRACT

A Fresnel phase plate lens of either the phase reversal plate or sinusoidal phase reversal plate type is formed in materials hitherto not available to be used to Fresnel phase plate lenses. The material for the desired Fresnel phase plate lens may be chosen for its optimum spectral transmission range. For example, for infrared spectral transmission, silicon and germanium are chosen for the materials to have the Fresnel phase plate lens formed therein. For the visible spectral transmission range various glasses such as crowns, flints, and borosilicates glasses of suitable optical quality are useful. High silica glasses and fused quartz (silicon dioxide) are useful as the lens material for ultraviolet spectral range.

18 Claims, 4 Drawing Figures

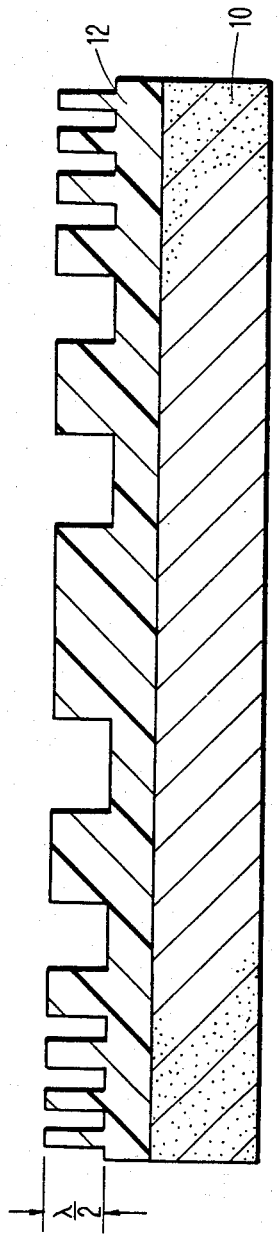 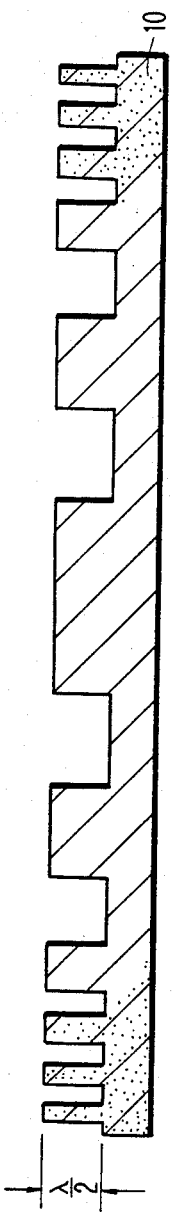 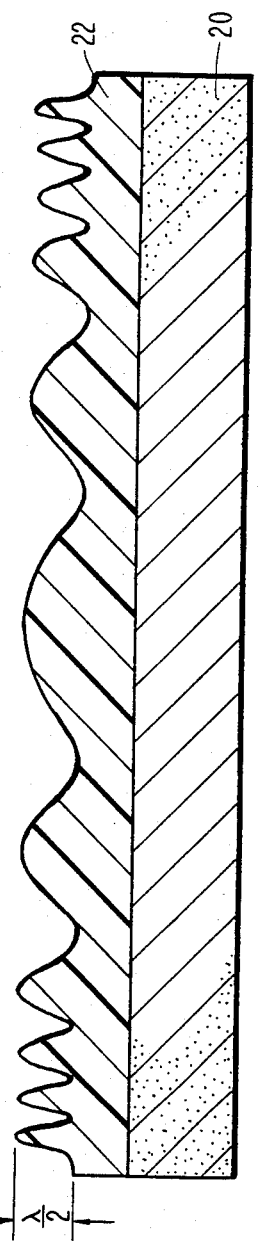 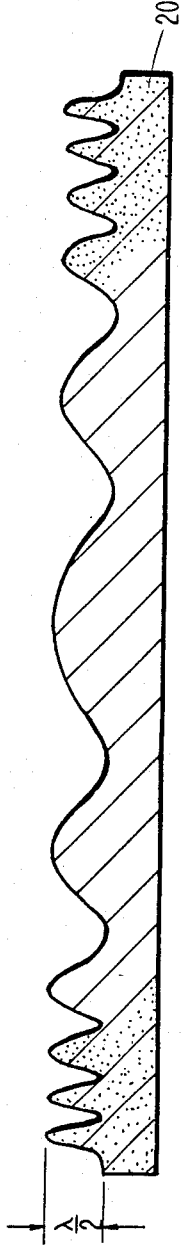

METHOD FOR MANUFACTURING FRESNEL PHASE REVERSAL PLATE LENSES

DESCRIPTION

1. Field of the Invention

This invention relates to Fresnel phase plate lenses made of materials which have long wearability such as silicon, germanium, glass, fused quartz glass and are particularly suited for different types of spectral transmission such as the infrared, visual and ultraviolet. The invention also relates to methods for very accurately forming such Fresnel phase plate lens.

2. Description of the Prior Art

Fresnel zone plates and phase plates have been known for many years. However, the Fresnel plates have remained largely a matter of academic interest because of the great difficulty in the manufacture of these lenses.

The first category of Fresnel lens is what may be termed a zone plate wherein there are alternate circular zones of zero and 100% transmission, that is opaque and transparent regions. These opaque and transparent regions become narrower along the radial distance from the lens center according to a particular formula which results in a thin lens with a short focal length and large diameter. A variation of this simple zone plate is the sinusoidal zone plate wherein instead of 100% transmission or no transmission there is a range of light transmission from zero to 100% according to a sinusoidal wave form. Again the width of the opaque and light transmitted regions change from wide to narrow with the radial dimension of the lens from its center. These types of lenses are discussed in the following: "Physical Optics" by Robert W. Wood copyrighted 1934, 1961 by Dover Publications Incorporated, New York, N.Y., pg. 37 through 39; "Optics" by Miles V. Klein, published by John Wiley & Sons, Inc., 1970 pg. 382 through 388; "Optical Physics" by S. G. Lipson et al., published by Press Syndicate of the University of Cambridge, England, 1981, pg. 135.

While the zone plate is discussed in virtually all optics textbooks, to illustrate Fresnel diffraction, the second type of Fresnel lens, the Fresnel phase reversal plate is not often mentioned in the literature. The Fresnel phase reversal plate is superior to that of the zone plate because the phase plate has almost 100% transmission of the light which strikes its surface as opposed to the zone plate which has only 50% of the light transmitted. The Fresnel phase reversal plate has the thickness of the plate changing by one-half wavelength in the medium of the plate in alternate zones. This is shown in FIGS. 1 and 2 of applicant's drawings. The width of the phase reversal zones decrease according to a specific formula with the radial distance from the center of the lens as with the zone plate. The other type of Fresnel phase reversal plate is the sinusoidal phase reversal plate wherein the thickness of the plate changes to a maximum depth of one-half wavelength in the material of the plate in a sinusoidal form from zone to zone. The sinusoidal phase reversal plate is shown in the applicant's FIGS. 3 and 4. The Physical Optics book by Robert W. Wood cited above at pages 38 and 39 describes the phase reversal zone plate and a very complex process for its manufacture.

The R. Deml et al., U.S. Pat. No. 3,948,660 describes Fresnel zone plate lens and a method for making such lens. The method described for forming the Fresnel lens from a body of light-sensitive material such as a photoresist or a dichromated gelatin layer. The method involves exposing the photosensitive material in the various zones to light to the extent necessary to impart to the respective portion the optical half-length requisite for the corresponding portion of the Fresnel lens to be formed. The patent describes the formation of zone plate lenses and not Fresnel phase reversal type lenses as may be seen in FIGS. 1 and 2 of the patent.

SUMMARY OF THE INVENTION

A Fresnel phase plate lens of either the phase reversal plate or sinusoidal phase reversal plate type is formed in materials hitherto not available to be used to Fresnel phase plate lenses. The material for the desired Fresnel phase plate lens may be chosen for its optimum spectral transmission range. For example, for infrared spectral transmission, silicon and germanium are chosen for the material to have the Fresnel phase plate lens formed therein. For the visible spectral transmission range various glasses such as crowns, flints, and borosilicates glasses of suitable optical quality are useful. High silica glasses and fused quartz (silicon dioxide) are useful as the lens material for ultraviolet spectral range.

A high quality Fresnel phase plate lens having light transmission of substantially all incident light may be formed by starting with a lens blank composed of a material suited for the wavelength of light for which it will ultimately be used. The lens blank is optically polished upon both major surfaces. A photosensitive layer capable of having photochemical changes therein by exposure to light is formed upon one of the lens blank's polished major surfaces. The layer is exposed to light through a suitable Fresnel mask pattern to form a pattern of the Fresnel phase plate in the photosensitive layer wherein the photochemical changes are affected depending upon the exposed intensity of light throughout the layer. The exposed layer is then developed to leave a physical Fresnel phase having a depth of one-half of the desired wavelength plate in the layer. The layer is anisotropically etched together with the lens blank in a suitable reactive ambient. The reactive etching ambient is chosen so as to anisotropically etch at the same rate both the photosensitive layer and the lens blank material. The etching is continued until the Fresnel phase plate pattern in the photosensitive layer is replicated in the lens blank to a maximum depth of a one-half of the desired wavelength is reached in the lens blank. Any remaining photosensitive layer is now removed from the lens to complete the formation of the Fresnel phase plate structure.

BRIEF DESCRIPTION OF THE DRAWINGS

The drawings show the following:

FIGS. 1 and 2 illustrate in cross-sectional view of a first method for forming a high quality Fresnel phase reversal plate lens of the invention.

FIGS. 3 and 4 illustrate in cross-section view a second embodiment for forming a Fresnel sinusoidal phase reversal plate lens according to the process of the present invention.

DESCRIPTION OF THE PREFERRED EMBODIMENTS

Referring now more particularly to FIGS. 1 and 2, there is shown a method for making the Fresnel phase reversal plate lens. The thin flat lens blank disk 10 is chosed of a desired material for the optimum spectral transmission range desired. The lens blank has a thickness for example of 1 to 4 millimeters for a 4 to 6 inch disk. The lens blank is polished according to conventional methods upon both major surfaces to a surface finish of the order of 0.2 micro inches (peak to valley height). This surface finish is measured according to the conventional stylus method described in "Report on the Measurement of Surface Finish by Stylus Method" by R. E. Reason, et al., published by the Rank Taylor Hobson Division, Leicester, England 1944.

A photosensitive coating 12 is formed upon one major polished surface of the lens blank 10 as seen in FIG. 1. The coating may be formed by the conventional spin-on technique. It is preferred to have the coating of a thickness of the order of 1 to 2 micrometers. One preferred example of a photosensitive layer capable of having photochemical changes by exposure to light is a negative or positive photoresist. The photosensitive layer is now exposed with light through a master zone plate mask which is formed of a chromium layer on a glass substrate which has been made by conventional semiconductor processing techniques. This chromium-glass Fresnel mask has concentric, alternate zones of opaque chromium regions and transparent regions formed according to the known formulas. A monochromatic light source such as a laser is utilized to cause the photochemical changes in the photosensitive layer 12. The exposure is carefully controlled in length of time and intensity of the monochromatic laser light source to expose the layer 12 to the desired depth of one-half of the wavelength of the monochromatic light source. This time of exposure and intensity of laser light is figured very carefully to produce the desired exposure depth. The exposed photosensitive layer 12 is now developed according to conventional photolithography and etching techniques wherein the exposed regions to the desired depth of one-half wavelength ($\lambda$), results in the layer 12 as shown in FIG. 1.

The structure shown in FIG. 1 is now placed in a reactive ion etching chamber which may be for example, that shown in the B. H. Desilets et al., U.S. Pat. 4,384,938, issued May 24, 1983, and assigned to the assignee of the present invention. The ambient of the reactive ion etching chamber is carefully chosen so as to anisotropically etch the photosensitive layer and the lens blank material at substantially the same rate. The anisotropic etching is continued until the desired replication of the pattern in the photosensitive film 12 is formed in the lens blank material 10 as seen in FIG. 2. The precise depth of the phase reversal plate regions of one-half wavelenght, $\lambda/2$, is obtained by use of a monitoring laser end point detector similar to the one described in "Handbook of Thin Film Technology" by L. I. Maissel and R. Glang, published by McGraw Hill 1970, Library of Congress, Catalog No. 73-7949739742 on pg. 1-114 and 1-115. The reactive ion etching process is continued until the thickest part of the resist film is gone and there is about 25 to 50% over etching. Since the reactive ion etching is almost perfectly anisotropic, the surface topology of the photosensitive film is transferred to the substrate 10. Any remaining photosensitive layer 12 is removed by for example etching or oxygen ashing.

Referring now to FIGS. 3 and 4 the second embodiment involving the method of forming a Fresnel sinusoidal phase reversal plate lens is described. As in the FIG. 1, FIG. 2 embodiment a thin flat optically polished disk of lens blank material 20 is coated with a layer of photosensitive material such as a negative or positive photoresist layer 22. The photosensitive layer may be of the order of 1 to 2 micrometers in thickness. The photosensitive material layer 20 is exposed to form a pattern of sinusoidal phase reversal regions therein by exposure to a pattern of interference fringes produced by two mutually coherent monochromatic point sources. This method is described for example in the above referenced "Optics" by M. V. Klein at pg. 386 to form a sinusoidal zone plate. The laser monochromatic light source used in the exposure must have a wavelength to which the photosensitive layer 20 is sensitive. However, this wavelength need not be the same as the wavelength at which the finished sinusoidal phase plate operates. The exposure time is set so that the photosensitive layer 20 becomes soluble in the developing solution in the brightest regions of the fringes to a depth equal to one-half of the working wavelength in the material in the photosensitive material 20. The photosensitive material is developed in appropriate photolithography solution which dissolves parts of the resist of the photosensitive material where the material is for example a positive photoresist, wnhich have been exposed to light and depolymerized, and leaves the unexposed regions essentially unattacked. The result of this developing and etching is shown in FIG. 3. The FIG. 3 structure is now subjected to anisotropic reactive ion etching as described in the above first embodiment of FIGS. 1 and 2 under conditions such that the etch rate of the photosensitive layer is approximately the same as that of the substrate lens blank material. The etching is continued using the end point detecting technique as described above until the desired replication is formed in the lens blank material 20 to produce the Fresnel sinusoidal phase reversal plate lens as shown in FIG. 4.

An alternative method may be used to the FIG. 1 and 2 embodiment for making a phase reversal zone plate. This method also uses a photosensitive coating, such as photoresist layer. However, the coating is fully exposed in the desired areas so that during development the coating is removed down to substrate. The photosensitive coating thickness is not critical so long as it exceeds a minimum thickness to resist reactive ion etching attack during the next step of forming substrate trenches to the depth of one-half wavelength. The depth of etching into the substrate is monitored with a laser interferometer to stop etching when depth is $\lambda/2$. Any residual resist is removed with solvent or $O_2$ plasma as in the FIGS. 1 and 2 embodiment. It is not necessary in the present embodiment that the etch rate ratio for photoresist layer to substrate be 1. The substrates should etch faster than the photoresist as is the usual case.

The method for forming the high quality Fresnel phase plate lens is such that virtually any desired lens blank material can have such a Fresnel lens formed therein. Therefore, it is readily possible to choose the material for its desired spectral light transmission range. For example, materials for the most efficient ultraviolet light transmission such as high silica glasses, fused quartz (silicon dioxide) and so forth may be used. In the visible light range the most important of the materials are high silica, borosilicates, crown or flint glasses. Materials in the infrared spectral range the preferred materials are germanium, silicon, alkali halides, and inorganic salts.

As discussed above it is very important to have a substantially the same etch rate during the anisotropic reactive ion etching between the photosensitive layer and the substrate layer lens blank. One commercially available photoresist material which can be utilized is Shipley AZ 1350. This photoresist comprises a meta creosol formaldehyde Novalak resin with a diazo naptho quinone sensitizer and an ethyl cellosolve acetate solvent. This and other known positive and negative photoresist can be used according to the methods described above in relation to FIGS. 1, 2, 3 and 4. During the reactive ion etching process where silicon is used as the lens blank the preferred reactive etching ambient is $CCl_3F$ or $CCl_2F_2$ and oxygen at a pressure of between about 20 to 60 millitorr and a flow rate of about 40 to 50 standard cc/min. Silicon etches faster than the photoresist in pure $CCl_2F_2$ so oxygen is added to increase the etch rate of the photoresist. Oxygen does not have a significant effect on the etch rate of silicon. A typical mixture to achieve the 1:1 etch rate ratio between silicon and the photoresist is 1 to 5% oxygen in the mixture and about 99 to 95% $CCl_2F_2$ or $CCl_3F$ in the ambient mixture. Where fused quartz (silicon dioxide) or the other various glasses is utilized as the lens blank material a reactive ion etching mixture of $CF_4$ and oxygen is utilized at a pressure of between about 22 to 60 millitorr and flow rate between about 40 to 50 standard cc/min. Silicon etches faster than the photoresist in pure $CF_4$ so again 1 to 5% oxygen is utilized in the ambient to achieve 1:1 etch rate ratio between the glasses material and the photoresist.

The following examples are included merely to aid in the understanding of the invention, and variations may be made by one skilled in the art without departing from the spirit and scope of the invention.

EXAMPLE I

The process for making a Fresnel sinusoidal phase reversal plate lens in silicon for use at infrared wavelengths starts by providing a disk of single crystal silicon (preferably undoped or low doped) which is optically polished on both sides. Such wafers are readily available from the semiconductor industry in diameters of 80 to 150 mm or more and thicknesses of 1 to 2 mm. In the wavelength range of 2 to 6 μm, silicon has a transmission of 98% or more.

The wafer is spin coated with a thin coating of a photosensitive Shipley AZ 1350 positive photoresist to a thickness of about 2 μm. Techniques for doing this are well known in the semiconductor industry.

The photoresist film is exposed to the interference pattern produced by two coherent point sources located at distances $D_1$ and $D_2$ from the resist and lying on an axis which passes through the center of the disk and is perpendicular to the disk. This produces a pattern of light and dark rings which get progressively narrower as one goes to the edge of the disk. The light intensity varies in a sinusoidal fashion in going from a light to a dark zone. The method of producing such a pattern, which is actually a hologram of a point object, is known and is described, for example, in "Optics" by M. V. Klein, John Wiley & Sons, Inc., (1969) on page 386.

Where, for example, one wishes to make a phase plate to operate at a wavelength of 6 μm (infrared) and to expose the resist with laser light of 0.6 μm. We use the focal length, f, of the finished infrared phase plate of 75 mm. Then $D_1$ and $D_2$ can be obtained from the formula (Klein pg. 388).

$$1/f_\pm = \lambda/\lambda^1(1/D_1 - 1/D_2)$$

or $$1/75 = 6/0.6(1/D_1 - 1/D_2)$$

$D_1$ or $D_2$ is arbitrarily chosen and the formula then specifies the other "D". For example, if $D_1$ were chosen as 300 mm, then $D_2$ would be 500 mm.

There was chosen a working wavelength of 6 μm for the Fresnel sinusoidal phase reversal phase and a focal length of 75 mm. The diameter of the plate is to be 150 mm which is about 6", so that the number of zones in the plate and the width of the outermost zone may be calculated from the expression:

$$r_n = \sqrt{f \lambda n}$$

where:
r = radius of nth zone
n = 1, 2, 3, . . .
f = 75 mm
λ = 6 μm

There are about 12,500 zones on the plate and the width of the outermost zone is 3 μm. The radius of the first zone is about 0.67 mm.

In the processing of a photoreist, the thickness of the surface layer which is dissolved in the subsequent development is dependent upon the exposure (exposure = intensity of light X time of exposure). For most photoresists there is a range of exposures where the dissolved thickness is linearly related to the exposure. See for example "Sensitometry of Resists for Microelectronics" D. B. Novotny, Photographic Science and Engineering, V 21, No. 6, Nov./Dec. 1977 pg. 351-355. The slope of the exposure-thickness dissolved curve can be changed by the amount of sensitizer in the resist formulation. The exposure of the photoresist is adjusted so that the peak to valley height in the exposed photoresist is one-half the working wavelength in the substrate. In the case at hand $\lambda/\mu = 6/4.5 = 1.33$ μm.

The exposed photoresist film is developed in a suitable developer such as an aqueous solution of sodium hydroxide. The photoresist is then baked at 150° C., for 30 minutes.

The next step is to transfer the surface topology, as it now exists in the photoresist layer, into the underlying silicon with very little distortion. This is done by a reactive ion etch process which results in a completely anisotropic etch of both the photoresist and underlying silicon. Etching occurs only in a direction normal to the plane of the disk lens blank.

Reactive ion etching of photoresist and silicon is carried out in a reactor of the type described, for example, by L. M. Ephrath in "Solid State Technology" July 1982, pg. 87–91. In this case it is desired that the etch rate of photoresist and silicon be substantially the same. In a plasma of $CClF_3$ silicon etches slightly faster than resist. By adding a small amount (1 to 5% by volume) of oxygen to the $CClF_3$ gas, the etch rate of the photoresist may be increased to just equal that of silicon. System pressures are in the range of 20 to 60 millitorr and typical gas flow rates through the system are 40 to 50 standard cc/min. The wafers are placed face up on the lower R.F. driven electrode. In the tooling used in the semiconductor industry, this driven electrode is often as much as 30" in diameter so that many wafers can be etched at one time if desired.

EXAMPLE 2

The process for the formation of a Fresnel sinusoidal phase reversal plate lens composed of fused quartz or silicon dioxide is identical to the one described in claim 1, except for the zone widths in this ultraviolet spectral transmission lens and in the reactive ion etching gas ambient utilized. In this case, the wavelength is chosen to be 350 nanometers, the diameter of the fused quartz disk is 15 millimiters and the foal length, f, is 25 millimiters. Using the expression:

$$r = \sqrt{f\lambda n}$$

the number of zones can be solved at 10,714. The radius of the first zone can be solved to be 72.46 micrometers and the radius of the last zone 10,714 can be solved at 0.45 micrometers.

In the case of anisotropic etching of the photoresist on fused quartz ($SiO_2$) as in a phase reversal plate Example I, the general physical set-up, gas pressures, and flow rates are in the same ranges as given above. The gas used, however, would be $CF_4$ plus a few percent of oxygen. In pure $CF_4$, fused quartz etches a little faster than photoresist. By adding about 1 to 5 percent by volume of oxygen, the etch rate of the photoresist may be increased until it just equals that of the fused quartz lens blank substrate.

It should be understood that where a Fresnel sinusoidal phase reversal plate lens is formed using one wavelength it is possible to use different wavelengths to use the formed lens. This may be more fully understood with reference to the M. V. Klein book entitled "Optics" pg. 388, when considering the formula:

$$1/D + 1/D^1 = \pm \lambda/\lambda^1(1/D_1 - 1/D_2)$$

where:
$D_1$ & $D_2$ = distances of laser point sources from plate
$D$ & $D^1$ = distances involved when plate is in use
$\lambda$ = wavelength used with finished plate
$\lambda^1$ = wavelength used to make plate An example of how this is applied is as follows. Make a sinusoidal phase reversal plate lens with a focal length of 30 mm and a diameter of 20 mm to be used at 350 nm wavelength and generated with a laser of wavelength 600 nm.

$$1/\infty + 1/30 = 350/600(1/D_1 - 1/D_2)$$

Let D equal 50 mm and $D_2$ will be 27.00 mm.

While invention was particularly shown and described with reference to the preferred embodiments thereof, it will be understood by those skilled in the art that the foregoing and other changes in form and details may be made therein without departing from the spirit and scope of the invention.

What is claimed is:

1. Method for making a high quality Fresnel phase plate lens having light transmission of substantially all incident light comprising:
   providing a polished lens blank composed of a material suited for the wavelength of light for which it will ultimately be used;
   depositing upon the polished side of said lens blank a photosensitive layer capable of having photochemical changes by exposure to light;
   exposing said layer with light to form a pattern of said Fresnel phase plate in said layer wherein said photochemical changes are effected depending upon the exposed intensity of light throughout said layer;
   developing the exposed said layer to leave a physical Fresnel phase plate in said layer;
   anisotropically etching said layer and said lens blank in a suitable reactive ambient where etching of the layer is substantially at the same rate as the lens blank;
   continuing said etching until the said phase plate pattern in said layer is replicated in said lens blank and a depth of one-half of the desired wavelength is reached in said lens blank to form said lens; and
   removing any remaining said layer from said Fresnel phase plate lens.

2. The method of claim 1 wherein the said lens material is for infrared light.

3. The method of claim 2 wherein the said lens material is silicon.

4. The method of claim 2 wherein the said lens material is germanium.

5. The method of claim 1 wherein the said lens material is for visible light.

6. The method of claim 5 wherein the said lens material is a glass.

7. The method of claim 1 wherein the said lens material is for ultraviolet light.

8. The method of claim 7 wherein the said lens material is fused quartz glass.

9. The method of claim 7 wherein the said material is high silica glass.

10. The method of claim 1 wherein the said layer is a photoresist.

11. The method of claim 3 wherein the said silicon is monocrystalline.

12. The method of claim 1 wherein the said exposing with light is through a master mask to form a Fresnel phase reversal plate type pattern in said layer and which produces in said lens blank after the composition of said etching a Fresnel phase reversal plate lens.

13. The method of claim 1 wherein said exposing with light is by a pattern of interferences fringes from two mutually coherent monochromatic point light sources to form a Fresnel sinusoidal phase reversal plate type pattern in said layer and which produces in said lens blank after the completion of said etching a Fresnel sinusoidal phase plate lens.

14. The method of claim 13 wherein said point sources are obtained using a single laser light sources with appropriate optics to effectively provide said point sources.

15. The method of claim 3 wherein the said anisotropically etching is done in a reactive ion etching process in an ambient of 96 to 95% by volume $CCl_2F_2$ and 1 to 5% by oxygen, and at a pressure of less than about 60 millitorr.

16. The method of claims 6, 8, or 9 wherein the said anisotropically etching is done in a reactive ion etching process in an ambient of 99 to 95% by volume $CF_4$ and 1 to 5% by volume oxygen, and at a pressure of less than about 60 millitorr.

17. The method of claim 1 wherein said etching is continued until said photosensitive layer is completely removed.

18. Method for making a high quality Fresnel phase reversal plate lens having light transmission of substantially all incident light comprising:

providing a polished lens blank composed of a material suited for the wavelength of light for which it will ultimately be used;

depositing upon the polished side of said lens blank a photosensitive layer capable of having photochemical changes by exposure to light;

exposing said layer with light to form a pattern of said Fresnel phase reversal plate in said layer;

developing the exposed said layer to leave a physical Fresnel phase reversal plate in said layer;

anisotropically etching said lens blank in a suitable reactive ambient until the said phase plate pattern in said layer is replicated in said lens blank and a depth of one-half of the desired wavelength is reached in said lens blank to form said lens; and removing any remaining said layer from said Fresnel phase reversal plate lens.

* * * * *